United States Patent
Nomiyama et al.

(10) Patent No.: US 10,145,989 B2
(45) Date of Patent: Dec. 4, 2018

(54) HYDROPHOBIZED PHOSPHOR AND LIGHT-EMITTING DEVICE

(71) Applicant: DENKA COMPANY LIMITED, Tokyo (JP)

(72) Inventors: Tomohiro Nomiyama, Fukuoka (JP); Shunsuke Mitani, Fukuoka (JP); Ryozo Nonogaki, Fukuoka (JP)

(73) Assignee: Denka Company Limited, Tokyo (JP)

( * ) Notice: Subject to any disclaimer, the term of this patent is extended or adjusted under 35 U.S.C. 154(b) by 120 days.

(21) Appl. No.: 15/300,676

(22) PCT Filed: Apr. 1, 2015

(86) PCT No.: PCT/JP2015/060387
§ 371 (c)(1),
(2) Date: Sep. 29, 2016

(87) PCT Pub. No.: WO2015/152341
PCT Pub. Date: Oct. 8, 2015

(65) Prior Publication Data
US 2017/0176647 A1  Jun. 22, 2017

(30) Foreign Application Priority Data

Apr. 2, 2014 (JP) ................. 2014-076400

(51) Int. Cl.
| | | |
|---|---|---|
| *H01L 33/00* | (2010.01) | |
| *G02B 1/10* | (2015.01) | |
| *G02B 1/18* | (2015.01) | |
| *C09K 11/08* | (2006.01) | |
| *C09K 11/77* | (2006.01) | |
| *H01L 33/56* | (2010.01) | |
| *C09K 11/02* | (2006.01) | |
| *H01L 33/50* | (2010.01) | |

(52) U.S. Cl.
CPC .............. *G02B 1/18* (2015.01); *C09K 11/025* (2013.01); *C09K 11/0883* (2013.01); *C09K 11/7734* (2013.01); *G02B 1/10* (2013.01); *H01L 33/502* (2013.01); *H01L 33/56* (2013.01); *H01L 33/501* (2013.01)

(58) Field of Classification Search
None
See application file for complete search history.

(56) References Cited

U.S. PATENT DOCUMENTS

2011/0031874 A1   2/2011   Hosokawa et al.
2012/0153226 A1   6/2012   Comanzo et al.

FOREIGN PATENT DOCUMENTS

| JP | 05052919 | 8/1993 |
|---|---|---|
| JP | 2005187797 | 7/2005 |
| JP | 2009167338 | 7/2009 |
| JP | 2012177049 | 9/2012 |
| JP | 2013173868 | 9/2013 |
| JP | 2013237713 | 11/2013 |

*Primary Examiner* — Alexander Ghyka
(74) *Attorney, Agent, or Firm* — Rudy J. Ng; Carol L. Francis; Bozicevic, Field & Francis LLP

(57) ABSTRACT

The present invention is directed to provide a hydrophobized phosphor not susceptible to separation at the interface with sealing resins and, by using this hydrophobized phosphor, a light-emitting device having excellent long-term stability and little change in luminance and emission color over time. The hydrophobized phosphor is characterized in that it comprises phosphor particles represented by the general formula $Si_{6-z}Al_zO_zN_{8-z}:Eu^{2+}$ (where z is larger than 0 and no more than 4.2); and a surface layer consisting of a hydrophobic substance deposited on the surfaces of the phosphor particles; wherein the hydrophobic substance consists of a long-chain fatty acid having 12 or more carbon atoms, a silicone oil having a viscosity of 1.5 Pa·s or less, or a combination thereof. The light-emitting device is characterized in that it comprises the hydrophobized phosphor and a light-emitting element.

2 Claims, No Drawings

HYDROPHOBIZED PHOSPHOR AND LIGHT-EMITTING DEVICE

TECHNICAL FIELD

The present invention relates to a hydrophobized phosphor that is not susceptible to separation at the interface with a sealing resin, and to a light-emitting device with excellent long-term stability, and having little change in luminance and emission color over time, due to the use of said hydrophobized phosphor. More specifically, the present invention relates to a hydrophobized phosphor wherein a hydrophobic surface layer is formed by depositing a specific hydrophobic substance on the surfaces of β-sialon phosphor particles, and a light-emitting device wherein this hydrophobized phosphor is dispersed in a sealing resin, and the resulting substance is applied to a light-emitting surface on which a light-emitting element is mounted, and cured.

BACKGROUND ART

β-sialon containing $Eu^{2+}$ in a solid solution is an oxynitride phosphor having β-sialon represented by the general formula $Si_{6-z}Al_zO_zN_{8-z}$ (where z is larger than 0 and no more than 4.2) as a host crystal, and containing $Eu^{2+}$ in a solid solution as an emission center, which is excited by UV-to-blue light and emits green light in the 520 to 560 nm range (Patent Document 1). $Eu^{2+}$-activated β-sialon phosphors have little decrease in luminance with temperature increases, and have excellent durability, and are therefore widely used as green-light-emitting phosphors for use in light-emitting diodes (hereinafter referred to as LEDs) in light-emitting devices.

When mounting such a phosphor in a light-emitting device, the phosphor is generally dispersed in a light-transmitting sealing resin such as an epoxy resin, a polycarbonate or a silicone rubber to form a slurry, and this slurry is applied so as to surround the light-emitting element on the light-emitting surface and cured.

However, conventional β-sialon phosphors do not have adequate wettability with sealing resins and therefore have low adhesion to sealing resins, so that in some cases, separation can occur at the interface between the phosphor and the sealing resin. Since separation at the interface causes refraction or scattering of light, the accumulation of separation at the interface with a sealing resin over time can cause reduced luminance and color shift. For this reason, there were problems in that, even if the β-sialon phosphor itself has excellent heat resistance and durability, the properties thereof were difficult to fully realize, and long-term stability could not be achieved.

RELATED ART DOCUMENTS

Patent Documents

Patent Document 1: JP 2008-303331 A

SUMMARY OF THE INVENTION

Problems to be Solved by the Invention

As a result of diligent analysis towards solving the above-mentioned problem, the present inventors discovered that, by depositing specific hydrophobic substances on the surfaces of β-sialon phosphor particles so as to provide thin-film surface layers consisting of hydrophobic substances, it can be made difficult for separation to occur at the interface with a sealing resin. Additionally, they discovered that, by using such a phosphor having a surface layer composed of a hydrophobic substance (hereinafter referred to as a "hydrophobized phosphor"), it is possible to obtain a light-emitting device with excellent long-term stability, having little change in luminance and emission color over time, thereby arriving at the present invention.

Means for Solving the Problems

In other words, the present invention is basically a hydrophobized phosphor comprising:

phosphor particles represented by the general formula $Si_{6-z}Al_zO_zN_{8-z}:Eu^{2+}$ (where z is larger than 0 and no more than 4.2); and a surface layer consisting of a hydrophobic substance deposited on the surfaces of the phosphor particles;

wherein the hydrophobic substance consists of a long-chain fatty acid having 12 or more carbon atoms, a silicone oil having a viscosity of 1.5 Pa·s or less, or a combination thereof.

Additionally, the present invention is basically a light-emitting device comprising the above-described hydrophobized phosphor and a light-emitting element.

Effects of the Invention

The hydrophobized phosphor of the present invention, by being provided with a surface layer consisting of a specific hydrophobic substance on the surface of the phosphor particles, has superior adhesion to sealing resins compared to conventional β-sialon phosphors, and is not susceptible to separation at the interface with sealing resins. Additionally, by using this hydrophobized phosphor, the light-emitting device of the present invention has excellent long-term stability, having little change in luminance and emission color over time. Specifically, the shift in the chromaticity coordinate CIE y value under JIS Z8701 after application of an electrical current of 150 mA for 1000 hours in an environment wherein the air temperature is 85° C. and the relative humidity is 85% can be held to within a range of ±5% with respect to the value before application of the electrical current.

Modes for Carrying Out the Invention

<Hydrophobized Phosphor>

The hydrophobized phosphor of the present invention comprises phosphor particles of β-sialon represented by the general formula $Si_{6-z}Al_zO_zN_{8-z}:Eu^{2+}$ (where z is larger than 0 and no more than 4.2), having a hydrophobic substance deposited in the form of a thin film on the surface thereof.

<Phosphor Particles>

The phosphor particles used in the hydrophobized phosphor of the present invention have $Eu^{2+}$ as emission centers dissolved as a solid solution in a matrix crystal of β-sialon represented by the general formula $Si_{6-z}Al_zO_zN_{8-z}$ (where z is larger than 0 and no more than 4.2), and a conventionally known β-sialon phosphor such as that described in the above-mentioned Patent Document 1 may be used.

In view of the emission efficiency, it is desirable for the phosphor particles to contain as much as possible of a β-sialon crystal phase of high purity, and if possible, to be composed of a single-phase β-sialon crystal, but a small quantity of unavoidable amorphous phases or other crystal phases may be included within a range such that the properties are not reduced.

If the average particle size of the phosphor particles is too small, the emission intensity will be low, the light will have a tendency to scatter, and it will tend to become difficult to achieve uniform dispersion into the sealing resin. On the other hand, if the average particle size of the phosphor particles is too large, there tend to be variations in the emission intensity and tone. For this reason, the 50% size (D50) in the cumulative fraction of the phosphor particles according to a volumetric standard is from 1 μm to 30 μm.

<Hydrophobic Substance>

The hydrophobic substance, by being deposited on the surfaces of the phosphor particles so as to form a thin-film surface layer, raises the "degree of hydrophobization", which is a measure of the affinity of the phosphor particles to hydrophobic substances. By raising the degree of hydrophobization, the wettability with sealing resins is improved, thereby suppressing the occurrence of separation at the interface with the sealing resin.

The "degree of hydrophobization" in the present invention is measured by the following method.
(1) 0.2 g of the hydrophobized phosphor to be measured is weighed out into a 500 ml triangular flask.
(2) 50 ml of ion-exchanged water is added to (1), and stirred with a stirrer.
(3) While stirring, methanol is dripped in with a burette, and the dripped amount when the entire amount of the hydrophobized phosphor becomes suspended in the ion-exchanged water is measured.
(4) The degree of hydrophobization is determined by the following formula.

$$\text{Degree of hydrophobization (\%)} = [\text{dripped methanol amount (ml)}] \times 100 / [\text{dripped methanol amount (ml)} + \text{ion-exchanged water amount (ml)}]$$

The degree of hydrophobization of the hydrophobized phosphor of the present invention is at least 10%, preferably at least 50%, more preferably at least 70%, and even more preferably at least 75%. If the degree of hydrophobization is at least 10%, the occurrence of separation at the interface with a sealing resin can be adequately reduced.

As hydrophobic substances that can make the degree of hydrophobization 10% or more, it is possible to use one or both of a long-chain fatty acid having 12 or more carbon atoms, and a silicone oil having a viscosity of 1.5 Pa·s or less.

As the long-chain fatty acid having 12 or more carbon atoms, it is possible to use typically a saturated or unsaturated higher fatty acid having 12-30 carbon atoms, preferably 12-22 carbon atoms. Examples of long-chain fatty acids having 12 or more carbon atoms that may be used in the present invention include lauric acid (C12), myristic acid (C14), oleic acid (C18), stearic acid (C18), linoleic acid (C18) and behenic acid (C22).

As the silicone oil having a viscosity of 1.5 Pa·s or less, it is possible to use typically a silicone oil having a viscosity in the range of 0.01 to 1.5 Pa·s, more preferably having a viscosity in the range of 0.04 to 0.8 Pa·s. If the viscosity of the silicone oil is too high, the thickness of the surface layer may not be able to be formed uniformly, and if the viscosity of the silicone oil is too low, the deposition rate to the phosphor particle surface may be lowered and sufficient hydrophobization may not be able to be achieved. The viscosity measurement is performed at 25° C.

Examples of silicone oils having a viscosity of 1.5 Pa·s or less that can be used in the present invention include hydroxy-terminated dimethylpolysiloxane, dimethyl silicone oil, methylphenyl silicone oil, methylhydrogen silicone oil, alkyl-modified silicone oil, polyether-modified silicone oil, amino-modified silicone oil, epoxy-modified silicone oil, epoxy/polyether-modified silicone oil, carboxyl-modified silicone oil and mercapto-modified silicone oil.

[Formation of Surface Layer]

The method for depositing the hydrophobic substance in the form of a thin film on the surface of the phosphor particles is not particularly limited as long as it is capable of uniformly mixing the phosphor particles and the hydrophobic substance.

Additionally, the hydrophobic substance may be used alone, or it may be used as a mixture with a solvent capable of dissolving the hydrophobic substance in order to aid in uniformly mixing with the phosphor particles. An example of such a solvent is ethanol or the like.

The amount of the hydrophobic substance added with respect to the phosphor particles is preferably an amount such that the thickness of the formed surface layer is at least 0.02 μm and at most 0.5 μm, and more preferably at least 0.04 μm and at most 0.2 μm. The thickness of the surface layer can be adjusted by changing the mixing ratio between the phosphor particles and the hydrophobic substance. Typically, the hydrophobic substance is preferably mixed in an amount of at least 1.0 mass % and at most 5.0 mass % with respect to 100 mass % of the phosphor particles. If the amount of the hydrophobic substance deposited or the thickness of the surface layer is too small, when dispersed in a sealing resin, the separation prevention effect at the interface with the sealing resin tends to be inadequate, and if the amount of the hydrophobic substance is too large, the curing of the sealing resin can be inhibited near the interface, and color shift may occur over time.

<Light Emitting Device>

The light emitting device of the present invention is provided with a phosphor comprising at least the above-mentioned hydrophobized phosphor, and a light-emitting element. Examples of light emitting devices include illumination devices, backlight devices, image display devices and signal devices.

The light-emitting element preferably emits light at a wavelength of 240 to 500 nm, among which blue LED light-emitting elements in the range of 420 to 500 nm are preferred.

As the phosphor used in the light-emitting device, another phosphor can be used in combination with the hydrophobized phosphor of the present invention. There are no particular limits on the other phosphor that can be used in combination with the hydrophobized phosphor of the present invention, and the phosphor may be appropriately chosen in accordance with the luminance and color rendering properties required in the light-emitting device. By intermixing the hydrophobized phosphor of the present invention with phosphors having different emission colors, it is possible to obtain white light of various color temperatures, from daylight color to incandescent light color.

The phosphor containing a hydrophobized phosphor of the present invention is mounted on a light-emitting device by dispersing the phosphor in a sealing resin to form a slurry, and molding this slurry so as to surround a light-emitting element on a light-emitting surface.

As the sealing resin, a thermosetting resin such as a silicone resin that is fluid at standard temperature can be used, an example of which is Toray Dow Corning JCR6175.

The phosphor containing a hydrophobized phosphor of the present invention is used by mixing at least 30 mass % and at most 50 mass % into a sealing resin.

The light-emitting device of the present invention uses a hydrophobized phosphor, and therefore is not susceptible to separation at the interface with a sealing resin. For this reason, the luminance decrease and color shift over time are small, and the device excels in long-term stability.

EXAMPLES

The present invention will be explained in further detail by referring to the examples indicated below.

Examples 1-7 and Comparative Examples 1-3

Examples 1-7 and Comparative Examples 1-3 are all based on β-sialon phosphors represented by the general formula $Si_{6-z}Al_zO_zN_{8-z}:Eu^{2+}$ (where z=0.04). Comparative Example 1 is a conventional phosphor that is not provided with a surface layer consisting of a hydrophobic substance on the surfaces of the phosphor particles, and Comparative Examples 2 and 3 are phosphors surface-treated with substances different from the hydrophobic substances defined in the present invention. On the other hand, Examples 1-7 are hydrophobized phosphors having surface layers formed by depositing the specific hydrophobic substances defined in the present invention on the surfaces of the phosphor particles.

Comparative Example 1

As described below, the phosphor of Comparative Example 1 was produced by performing a mixing step of mixing the raw materials, a baking step of baking the raw materials after the mixing step, and an annealing step and an acid treatment step for post-treatment of the sintered body after the baking step.

<Mixing Step>

95.45 mass % of an α-silicon nitride (manufactured by Ube Industries, grade SN-E10, oxygen content 1.0 mass %), 3.1 mass % of aluminum nitride (manufactured by Tokuyama Corporation, grade E, oxygen content 0.8 mass %), 0.66 mass % of aluminum oxide (manufactured by Taimei Chemicals, grade TM-DAR) and 0.79 mass % of europium oxide (manufactured by Shin-etsu Chemical, grade RU) were weighed out. The blending ratio of the raw materials was designed so that in the general formula $Si_{6-z}Al_zO_zN_{8-z}$ for β-sialon when excluding the europium oxide, z=0.04 would be satisfied. This raw material powder was dry-mixed for 10 minutes in a V-type mixer (manufactured by Tsutsui Scientific Instruments, S-3). In order to make the size of the raw material uniform, the raw material after mixture was passed through a nylon sieve having a mesh size of 250 μm, and then used in the following step.

<Baking Step>

The sifted mixture was loaded into a lidded cylindrical boron nitride container (manufactured by Denka, grade N-1), and baked by leaving for 15 hours at 2000° C. in a nitrogen atmosphere pressurized to 0.8 MPa inside an electric furnace having a carbon heater. After the baking was completed, the container was removed and let stand until room temperature was reached. The resulting ingot-shaped baked material was crushed with a roll crusher in order to obtain a particle size and particle form required as a phosphor. The powder was passed through a sieve having a mesh size of 150 μm, then used in the following step.

<Annealing Step>

The powder which was sifted after the baking step was allowed to stand for 8 hours at 1450° C. in an argon gas atmosphere.

<Acid Treatment Step>

After the annealing step, the powder was subjected to an acid treatment by immersing for 30 minutes in an acid mixture of hydrofluoric acid and nitric acid. In order to separate the acid from the powder after the acid treatment, the powder was flushed through a synthetic resin filter together with the acid mixture, and the powder remaining on the filter was rinsed with water to obtain the phosphor of Comparative Example 1 represented by $Si_{6-z}Al_zO_zN_{8-z}:Eu^{2+}$ (where z=0.04).

Example 1

The phosphor particle of Comparative Example 1 was blended with oleic acid (manufactured by Kanto Kagaku, Cica Grade 1) at a ratio of 1.0 mass % of the oleic acid with respect to 100 mass % of the phosphor particles, and mixed for 10 minutes. After mixture, the powder was sifted using a sieve having a mesh size of 75 μm, and the hydrophobized phosphor of Example 1 having a surface layer consisting of oleic acid with a thickness of 0.04 μm was obtained.

Examples 2-7 and Comparative Examples 2-3

Examples 2-7 and Comparative Examples 2 and 3 were produced using the same methods and conditions as in Example 1, except that the hydrophobic substances used and the amounts thereof were respectively changed as indicated below.

In Examples 2 and 3, the oleic acid content was set respectively to 3.0 mass % and 5.0 mass % with respect to 100 mass % of the phosphor particles.

In Example 4, 1.0 mass % of lauric acid (manufactured by Kanto Kagaku) diluted with ethanol was used as the hydrophobic substance with respect to 100 mass % of the phosphor particles.

In Example 5, 1.0 mass % of stearic acid (manufactured by Tokyo Chemical Industry) diluted with ethanol was used as the hydrophobic substance with respect to 100 mass % of the phosphor particles.

In Example 6, 1.0 mass % of behenic acid (manufactured by Kanto Kagaku) diluted with ethanol was used as the hydrophobic substance with respect to 100 mass % of the phosphor particles.

In Example 7, 1.0 mass % of a silicone oil (manufactured by Momentive Performance Materials Japan, YF3800) having a viscosity of 0.08 Pa·s was used as the hydrophobic substance with respect to 100 mass % of the phosphor particles.

In Comparative Example 2, 1.0 mass % of hexanoic acid (manufactured by Kanto Kagaku) diluted with ethanol was used as the hydrophobic substance with respect to 100 mass % of the phosphor particles. Hexanoic acid is a medium-chain fatty acid having six carbon atoms.

In Comparative Example 3, 1.0 mass % of a silicone oil (manufactured by Shin-etsu Chemical, KF-96-3000cs) having a viscosity of 3.0 Pa·s was used as the hydrophobic substance with respect to 100 mass % of the phosphor particles.

Evaluation of Phosphor

Next, the resulting hydrophobized phosphors (or phosphors) were evaluated by the following method. The evaluation results are shown in Table 1.

TABLE 1

| | | | Examples | | | | | | | Comparative Examples | | |
|---|---|---|---|---|---|---|---|---|---|---|---|---|
| | | | 1 | 2 | 3 | 4 | 5 | 6 | 7 | 1 | 2 | 3 |
| Surface Layer Film Thickness (μm) | Oleic acid | | 0.04 | 0.12 | 0.20 | — | — | — | — | — | — | — |
| | Lauric acid | | — | — | — | 0.04 | — | — | — | — | — | — |
| | Stearic acid | | — | — | — | — | 0.04 | — | — | — | — | — |
| | Behenic acid | | — | — | — | — | — | 0.04 | — | — | — | — |
| | Hexanoic acid | | — | — | — | — | — | — | — | — | 0.03 | — |
| | Silicone oil, viscosity 0.08 Pa · s | | — | — | — | — | — | — | 0.04 | — | — | — |
| | Silicone oil, viscosity 3.0 Pa · s | | — | — | — | — | — | — | — | — | — | 0.04 |
| Evaluation | Degree of hydrophobization (%) | | 75 | 86 | 91 | 75 | 78 | 75 | 91 | 0 | 5 | 90 |
| | Internal quantum efficiency (%) | | 60 | 60 | 58 | 60 | 60 | 60 | 60 | 63 | 63 | — |
| | External quantum efficiency (%) | | 37 | 37 | 38 | 37 | 37 | 37 | 37 | 38 | 38 | — |
| | Chromaticity CIE x | | 0.285 | 0.285 | 0.287 | 0.285 | 0.285 | 0.287 | 0.285 | 0.283 | 0.283 | — |
| | Chromaticity CIE y | | 0.671 | 0.670 | 0.670 | 0.670 | 0.671 | 0.670 | 0.670 | 0.674 | 0.674 | — |
| | Relative peak intensity (%) | | 193 | 194 | 197 | 193 | 193 | 195 | 196 | 187 | 187 | — |
| | Luminous flux retention rate (%) | Drive time (hr) | 0 | 100 | 100 | 100 | 100 | 100 | 100 | 100 | 100 | 100 | — |
| | | | 500 | 97 | 98 | 94 | 97 | 98 | 95 | 99 | 93 | 93 | — |
| | | | 1000 | 94 | 96 | 92 | 94 | 96 | 93 | 97 | 88 | 88 | — |
| | Chromaticity CIE y retention rate (%) | Drive time (hr) | 0 | 100 | 100 | 100 | 100 | 100 | 100 | 100 | 100 | 100 | — |
| | | | 500 | 98 | 98 | 97 | 97 | 98 | 98 | 98 | 96 | 96 | — |
| | | | 1000 | 96 | 97 | 95 | 96 | 97 | 96 | 98 | 93 | 93 | — |

<Surface Layer Film Thickness>

The surface layer film thickness (μm) is the film thickness of the surface layer formed by the hydrophobic substance deposited on the surface of the phosphor particles, and is calculated by the following formula.

Film thickness (μm) = [Surface layer volume (m$^3$)/ Phosphor surface area (m$^2$)]×10$^6$ Surface layer volume (m$^3$) = Surface layer mass (g)/ [Surface layer density (g/cm$^3$)×10$^6$]

Phosphor surface area (m$^2$) = Phosphor specific surface area (m$^2$/g)×Total phosphor mass (g)

<Degree of Hydrophobization>

As mentioned above, the degree of hydrophobization (%) was measured by the following method.
(1) 0.2 g of the hydrophobized phosphor to be measured is weighed out into a 500 ml triangular flask.
(2) 50 ml of ion-exchanged water is added to (1), and stirred with a stirrer.
(3) While stirring, methanol is dripped in with a burette, and the dripped amount when the entire amount of the hydrophobized phosphor becomes suspended in the ion-exchanged water is measured.
(4) The degree of hydrophobization is determined by the following formula.

Degree of hydrophobization (%) = [dripped methanol amount (ml)]×100/[dripped methanol amount (ml)+ion-exchanged water amount (ml)]

<Internal Quantum Efficiency and External Quantum Efficiency>

The quantum efficiencies of the hydrophobized phosphors were evaluated at ambient temperature by the following method.

A standard reflective plate (manufactured by Labsphere, Spectralon) having a reflectivity of 99% was set at a side-surface aperture (φ10 mm) of an integrating sphere (φ60 mm). As an emission light source, monochromatic light divided into a wavelength of 455 nm from a Xe lamp was directed to this integrating sphere through an optical fiber, and the spectrum of the reflected light was measured using a spectrophotometer (manufactured by Otsuka Electronics, MCPD-7000). At that time, the number of excitation light photons (Qex) was calculated based on the spectrum in the wavelength range of 450 to 465 nm.

Next, recessed cells filled with hydrophobized phosphors so that the surfaces were flat were set at the aperture of the integrating sphere and illuminated with monochromatic light of wavelength 455 nm, and the spectra of the reflected excitation light and the fluorescent light were measured by a spectrophotometer. The number of photons of the reflected excitation light (Qref) and the number of photons of fluorescent light (Qem) were calculated from the resulting spectral data.

The number of reflected excitation light photons was measured in the same wavelength range as the number of excitation light photons, and the number of fluorescent light photons was calculated in the range of 465 to 800 nm.

From the numbers of these three types of photons, the external quantum efficiency (%)=Qem/Qex×100 and the internal quantum efficiency (%)=Qem/(Qex−Qref)×100 were determined.

<Chromaticity CIE x and Chromaticity CIE y>

The chromaticity coordinates were measured using a spectrophotometer (manufactured by Otsuka Electronics, MCPD-7000). As the excitation light, blue light having a wavelength of 455 nm was used.

The phosphors to be measured were loaded into the sample portion of the spectrophotometer, the surfaces were flattened, and the integrating sphere was attached. As an emission light source, monochromatic light divided into a wavelength of 455 nm from a Xe lamp was directed to this integrating sphere using an optical fiber. This monochromatic light was shone onto the phosphor and measured. Among the measurement results, the data from the wavelength range of 465 to 780 nm were used to compute the chromaticity coordinates CIE x and CIE y in the XYZ color system as defined in JIS Z8701 in accordance with JIS Z8724.

<Relative Peak Intensity>

As the relative peak intensity (%), the relative intensity when the peak height of the emission spectrum of a YAG:Ce phosphor (manufactured by Kasei Optonix, P46Y3) was 100% was determined.

<Luminous Flux Retention Rate>

The luminous flux retention rate (%) is a value for evaluating the attenuation of the intensity (luminance) of light over time. The luminous flux retention rate (%) was evaluated by producing a light-emitting device having the hydrophobized phosphor to be measured mounted on the light-emitting surface side of an LED, and comparing the luminous flux before and after driving the light-emitting device for a standard period of time in a high-temperature, high-humidity environment.

(Production of Light-Emitting Device)

A light-emitting device was produced by injecting 3.4 µL of a slurry obtained by stirring and mixing 50 mass % of the hydrophobized phosphor to be measured and 50 mass % of a silicone resin (manufactured by Toray Dow Corning, JCR6175) into two top-view type packages having LED chips, and curing the slurry by heating at 150° C. for 2 hours. The LED chips were of the type emitting blue light having a peak at a wavelength of 460 nm.

(Luminous Flux Retention Rate Calculation Method)

The luminous flux was measured using an LED measuring device (manufactured by Instrument System, CAS140B).

A light-emitting device on which a hydrophobized phosphor to be measured was mounted was driven for 500 hours and 1000 hours by applying an electric current (150 mA) in an environment of temperature 85° C. and humidity 85%, and the luminous flux was measured afterwards. The luminous flux retention rates are the values of the luminous flux of the LED after 500 hours have elapsed and the luminous flux of the LED after 1000 hours have elapsed, divided by the luminous flux before applying the electric current (0 hours elapsed), multiplied by 100. A passing value after 1000 hours was 90% or more.

<Chromaticity CIE y Retention Rate>

The chromaticity CIE y retention rate (%) is a value for evaluating the color shift over time. The chromaticity CIE y retention rate (%) was evaluated by comparing the chromaticity CIE y before and after driving for a standard period of time in a high-temperature, high-humidity environment using the same light-emitting device and measurement conditions as in the measurement method for the luminous flux retention rate. Specifically, they are the values of the chromaticity CIE y after 500 hours have elapsed and the chromaticity CIE y after 1000 hours have elapsed, divided by the chromaticity CIE y before applying the electric current (0 hours elapsed), multiplied by 100. A passing value after 500 hours was 90%, and a passing value after 1000 hours was 95%.

As shown in Table 1, no large differences were observed between the hydrophobized phosphors of Examples 1-7 and the phosphors of Comparative Examples 1 and 2 in terms of the internal quantum efficiency, the external quantum efficiency, the chromaticity CIE x, the chromaticity CIE y and the relative peak intensity. However, the phosphors of Comparative Examples 1 and 2 did not satisfy the criteria for passing in terms of the luminous flux retention rate and the chromaticity CIE y retention rate after 1000 hours, while the hydrophobized phosphors of Examples 1-7 all satisfied the criteria for passing, and were confirmed to have little change in luminance and emission color over time.

Comparative Example 3 was not evaluated because the silicone oil used as a hydrophobic substance was of high viscosity, and was not able to form a surface layer of uniform film thickness on the surfaces of the phosphor particles.

Example 8

A light-emitting device was produced by mounting the hydrophobized phosphor of Example 1 on the light-emitting surface of a blue-light LED as the emission light source. This light-emitting device used the hydrophobized phosphor of Example 1, and therefore had excellent long-term stability, with less change in luminance and emission color over time than a light-emitting device using the phosphor of Comparative Example 1.

The invention claimed is:
1. A hydrophobized phosphor comprising:
   phosphor particles represented by the general formula $Si_{6-z}Al_zO_zN_{8-z}:Eu^{2+}$ (where z is larger than 0 and no more than 4.2); and
   a surface layer consisting of a hydrophobic substance deposited on the surfaces of the phosphor particles;
   wherein the hydrophobic substance consists of a long-chain fatty acid having 12 or more carbon atoms, a silicone oil having a viscosity of 1.5 Pa·s or less, or a combination thereof.
2. A light-emitting device comprising the hydrophobized phosphor according to claim 1, and a light-emitting element.

* * * * *